United States Patent
Jiang

(10) Patent No.: US 11,153,995 B2
(45) Date of Patent: Oct. 19, 2021

(54) POWERPACK STATION

(71) Applicant: Shenzhen Chifrog Technology Co., Ltd., Shenzhen (CN)

(72) Inventor: Yunzheng Jiang, Shenzhen (CN)

(73) Assignee: Shenzhen Chifrog Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/858,708

(22) Filed: Apr. 26, 2020

(65) Prior Publication Data

US 2020/0344919 A1    Oct. 29, 2020

(51) Int. Cl.

| | |
|---|---|
| *H05K 7/20* | (2006.01) |
| *H05K 7/14* | (2006.01) |
| *H05K 5/00* | (2006.01) |
| *H05K 5/02* | (2006.01) |
| *F21L 4/00* | (2006.01) |
| *H01M 10/0525* | (2010.01) |
| *H01M 10/6563* | (2014.01) |
| *H01M 10/613* | (2014.01) |
| *H01M 10/42* | (2006.01) |

(Continued)

(52) U.S. Cl.
CPC ............ *H05K 7/20909* (2013.01); *F21L 4/00* (2013.01); *F21V 29/83* (2015.01); *H01M 10/0525* (2013.01); *H01M 10/425* (2013.01); *H01M 10/613* (2015.04); *H01M 10/6563* (2015.04); *H01M 50/20* (2021.01); *H05K 5/0086* (2013.01); *H05K 5/023* (2013.01); *H05K 7/1427* (2013.01); *H05K 7/20145* (2013.01); *H01M 2010/4271* (2013.01); *H01M 2220/30* (2013.01)

(58) Field of Classification Search
None
See application file for complete search history.

(56) References Cited

U.S. PATENT DOCUMENTS

| | | |
|---|---|---|
| D227,680 S | 7/1973 | Fischer |
| D658,581 S | 5/2012 | Reade |
| 9,072,572 B2 * | 7/2015 | Gill ......................... H05B 45/37 |

(Continued)

OTHER PUBLICATIONS

Anker Powerhouse Portable Rechargeable Generator. Found online Oct. 9, 2020 at amazon.com. Reference dated Oct. 6, 2018. Retrieved from https ://www.amazon.com/gp/product/B07 DD H C5 MV /ref=as_l i_qf_asi n_il_tl. (Year: 2018).

(Continued)

*Primary Examiner* — Britt D Hanley
(74) *Attorney, Agent, or Firm* — Calfee, Halter & Griswold LLP

(57) ABSTRACT

An energy storage power supply is provided and includes a shell and a plurality of compartments, including a mainboard compartment for installing a circuit mainboard of the power supply, a battery compartment for installing a battery, a lighting compartment for installing a lamp panel, and a pair of heat dissipation air ducts. The lighting compartment, battery compartment and mainboard compartment are arranged from one end of the shell to the shell's other end sequentially. The pair of heat dissipation air ducts are arranged on two sides of one or more of the mainboard compartment and/or lighting compartment to prevent heat generated in the mainboard compartment and/or the lighting compartment from being dissipated into the battery compartment.

10 Claims, 3 Drawing Sheets

(51) Int. Cl.
*F21V 29/83* (2015.01)
*H01M 50/20* (2021.01)

(56) References Cited

U.S. PATENT DOCUMENTS

| | | | |
|---|---|---|---|
| D766,824 S | 9/2016 | Li | |
| D768,073 S | 10/2016 | Kim | |
| D780,116 S | 2/2017 | Bing | |
| 10,294,858 B2 | 5/2019 | Lan | |
| 10,403,866 B2* | 9/2019 | Vasefi | H01M 50/20 |
| D867,283 S | 11/2019 | Hoffmann | |
| D870,043 S | 12/2019 | Xu | |
| D883,206 S | 5/2020 | Bai | |
| D887,357 S | 6/2020 | Liao | |
| 10,873,192 B2* | 12/2020 | Vasefi | H01M 16/00 |
| 2002/0070552 A1 | 5/2002 | Higuchi | |
| 2005/0225177 A1* | 10/2005 | Jacobs | H02J 1/08 307/82 |
| 2009/0189549 A1* | 7/2009 | Crawford | F21V 23/0414 315/309 |
| 2013/0043826 A1* | 2/2013 | Workman | H01M 50/20 320/101 |
| 2015/0091392 A1* | 4/2015 | Hwang | H02J 7/0045 307/150 |
| 2016/0369994 A1* | 12/2016 | Liu | F21V 17/12 |
| 2017/0047755 A1* | 2/2017 | Workman | H01R 13/5202 |
| 2018/0034015 A1* | 2/2018 | Krantz | H01G 9/08 |
| 2018/0109053 A1 | 4/2018 | Hongpeng | |
| 2020/0116313 A1 | 4/2020 | Harvey | |
| 2020/0344919 A1* | 10/2020 | Jiang | H01M 10/0525 |

OTHER PUBLICATIONS

Rockpals Portable Generator. Found online Oct. 13, 2020 at amazon.com. Reference dated Apr. 27, 2017. Retrieved from https://www.amazon.com/dp/B075SSMR6K/ref=sspa_dk_detail_5. (Year: 2017).
"Portable PowerCube Traveler". Found online Oct. 13, 2020 at sourcing.hktdc.com. Reference dated Oct. 13, 2020. Retrieved from https://sourcing.hktdc.com/en/Product-Detail/Mini-Portable-PowerCube-Traveler/3520213. (Year: 2020).
Office Action from U.S. Appl. No. 29/698,533 dated Oct. 26, 2020.

* cited by examiner

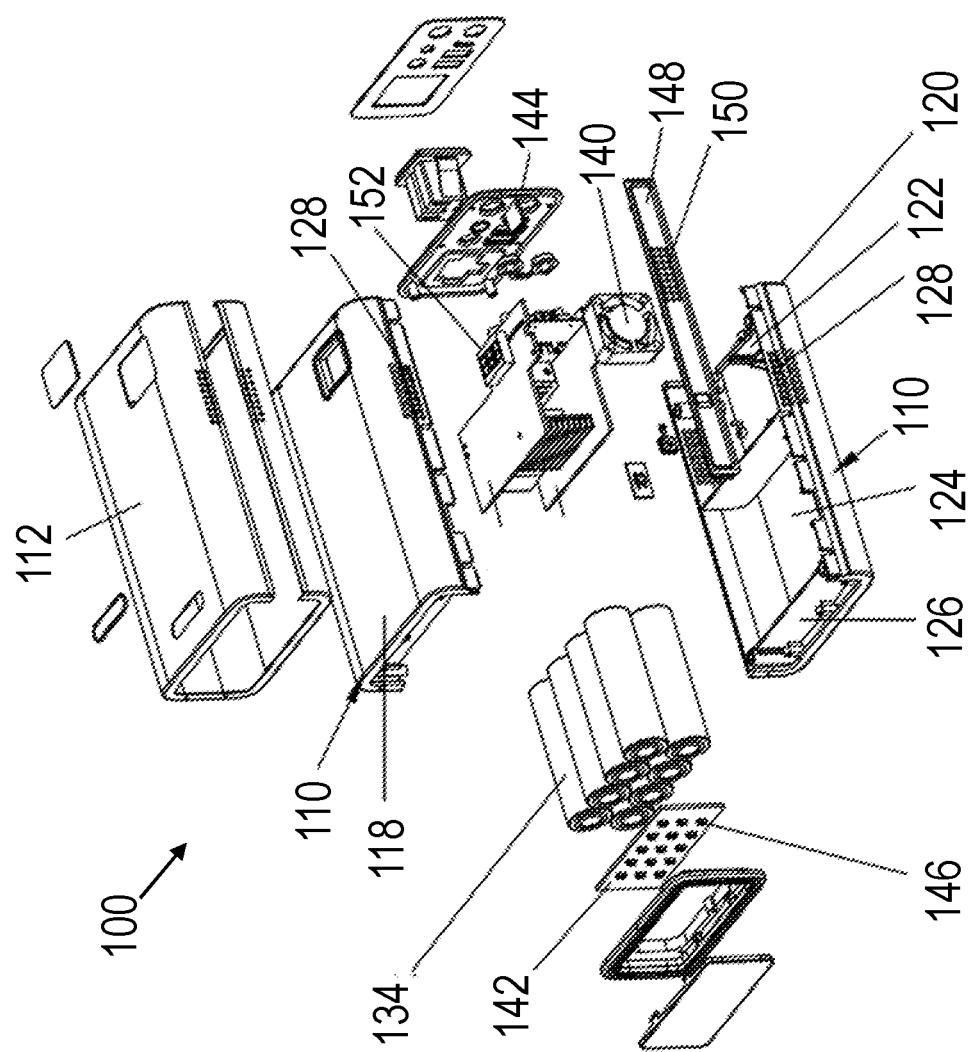

POWERPACK STATION

CROSS-REFERENCE TO RELATED APPLICATIONS

This application is based upon and claims priority to Chinese Patent Application No. 201920585771.XU, filed Apr. 26, 2019, the entire disclosure of which is incorporated herein by reference.

TECHNICAL FIELD

The present disclosure relates generally to electrical devices, and more particularly, to an energy storage power supply.

BACKGROUND

Traditional energy storage power supply devices (power supply devices) include circuits and/or circuit boards fully enclosed within the power supply devices housing structure. During operation, and as a voltage conversion and storage device, the traditional power supply devices have a relatively large calorific value when providing a voltage conversion function. A significant amount of heat is generated during the voltage conversion function, and if the generated heat is not timely dissipated from the power supply device, its enclosed components (e.g., its circuits and/or circuit boards) may become fused and burnt. This fusing and burning due to excessive electric heat presents several safety hazard and may render the traditional power supply device unfit for its purpose.

As such, the heat dissipation of the energy storage power supply is a problem that must be considered when it is operated normally.

Accordingly, a need exists for an energy storage power supply with improved heat dissipation capabilities.

In view of the above issues related to heat dissipation of traditional power supply devices, there is an unmet need for an improved power supply device (e.g., a powerpack station) with improved heat dissipation capabilities for preventing fusing and/or burning of the powerpack station's components.

SUMMARY

At least one objective of the present disclosure is to provide a power supply device that includes a plurality of compartments arranged and configured within the power supply device to limit or otherwise prevent heat generated in one compartment from being dissipated into the other compartments. In order to achieve the above objective, the following technical solutions may be adopted.

In an exemplary embodiment, an energy storage power supply is provided and includes a shell, a mainboard compartment for installing a circuit mainboard of the energy storage power supply, a battery compartment for installing a battery of the energy storage power supply, a lighting compartment for installing a lamp panel of the energy storage power supply, and a pair of heat dissipation air ducts. The lighting compartment, battery compartment, and mainboard compartment are arranged from one end to the other end of the shell sequentially, and the pair of heat dissipation air ducts are arranged on two sides of at least the mainboard compartment one by one correspondingly.

It should be appreciated that the general inventive concepts disclosed herein have the beneficial effects that: by separately arranging the three compartments in the shell of the energy storage power supply, e.g., in a separate compartment-type structure, the heat sources within the shell are separated, which can prevent heat generated in one or more compartments (e.g., the mainboard compartment and/or the lighting compartment) from being dissipated into other compartments (e.g., the battery compartment). Separation of the heat sources, according to the general inventive concepts, may prevent the battery from failures during normal operation due to high temperature. Additionally, the arrangement of the heat dissipation air ducts (e.g., at one side or at opposed sides of the mainboard compartment) may facilitate the dissipation of heat inside the mainboard compartment.

Further, the circuit mainboard is composed of a plurality of circuit boards which are mutually spaced and stacked in the mainboard compartment. Employing the further solution above has the beneficial effects that: the circuit board is modularly designed and stacked to reduce the space occupied by the circuit board and improve the heat dissipation efficiency of the circuit board; moreover, the circuit boards are spaced apart to prevent short circuit between the circuits, which facilitates the installation and maintenance of the circuit board.

Further, the plurality of circuit boards are respectively an AC circuit board, a DC circuit board, an interface circuit board, a lighting circuit board, a key circuit board and a battery protection board.

Further, a heat dissipation fan is further included, wherein the heat dissipation fan can be rotatably arranged at one side of the mainboard compartment, and an air outlet of the heat dissipation fan is arranged opposite to one heat dissipation air duct in the pair of heat dissipation air ducts. Employing the further solution above has the beneficial effects that: the arrangement of the heat dissipation fan improves the heat dissipation efficiency inside the mainboard compartment and improves the reliability of the energy storage power supply.

Further, the lighting compartment, the battery compartment and the mainboard compartment are integrally formed with the shell. Employing the further solution above has the beneficial effects that: the lighting compartment, the battery compartment and the mainboard compartment are integrally formed with the shell, which facilitates the production and installation of the shell, improves the loading capacity of the shell, and improves the stability of the shell. Further, an outer wall of the shell is coated with leather. Employing the further solution above has the beneficial effects that: the arrangement of the leather improves the aesthetics of the energy storage power source; when a user carries the energy storage power source, the energy storage power source has high friction, which improves the user experience and improves the comfort level of the user.

Further, a lamp panel and an interface panel are further included, wherein the lamp panel is provided with a lamp, the lamp panel is installed in the lighting compartment, the interface panel is arranged at the other end of the shell, and the interface panel is detachably provided with a socket. Employing the further solution above has the beneficial effects that: the arrangement of the lamp panel enables the energy storage power source to have a lighting function, and an interface in the interface panel is used to connect other electrical appliance parts.

Further, a lateral panel is further included, wherein the lateral panel is provided with a heat dissipation hole, and the lateral panel is arranged on one side of the shell. Employing the further solution above has the beneficial effects that: the arrangement of the lateral panel facilitates the installation and disassembly of the energy storage power source, and facilitates the maintenance of the energy storage power source.

Further, the shell comprises an upper shell and a lower shell, the upper shell is detachably buckled on the lower shell, the upper shell and the lower shell are fixed by four screws, and the lateral panel is clamped at a junction position of the upper shell and the lower shell. Employing the further solution above has the beneficial effects that: the assembling design of the upper shell and the lower shell facilitates the installation and maintenance of the energy storage power supply.

Further, a display screen and a battery are further included, wherein the display screen is arranged at a top end of the shell, the battery is arranged in the battery compartment, and the battery is a battery pack/set consisting of eight 21700-4000 mAh lithium ion batteries in two-parallel four-series connection.

Employing the further solution above has the beneficial effects that: the arrangement of the display screen and the battery is convenient for the user to visually check the state of the energy storage power supply, and is convenient for the user to perform charge management on the energy storage power supply.

These and other objects, features and advantages of the present disclosure will become apparent from the following detailed description of illustrative embodiments thereof, which is to be read in connection with the accompanying drawings.

BRIEF DESCRIPTION OF THE DRAWINGS

These and other features of the present disclosure will become better understood with regard to the following description and accompanying drawings in which:

FIG. 3 illustrates an exploded view of an exemplary embodiment of an energy storage power supply in accordance with the general inventive concepts.

DETAILED DESCRIPTION

Aspects and implementations of the present disclosure will be understood more fully from the detailed description given below and from the accompanying drawings of the various aspects and implementations of the disclosure. This should not be taken to limit the disclosure to the specific aspects or implementations, but explanation and understanding only.

Figure 1:
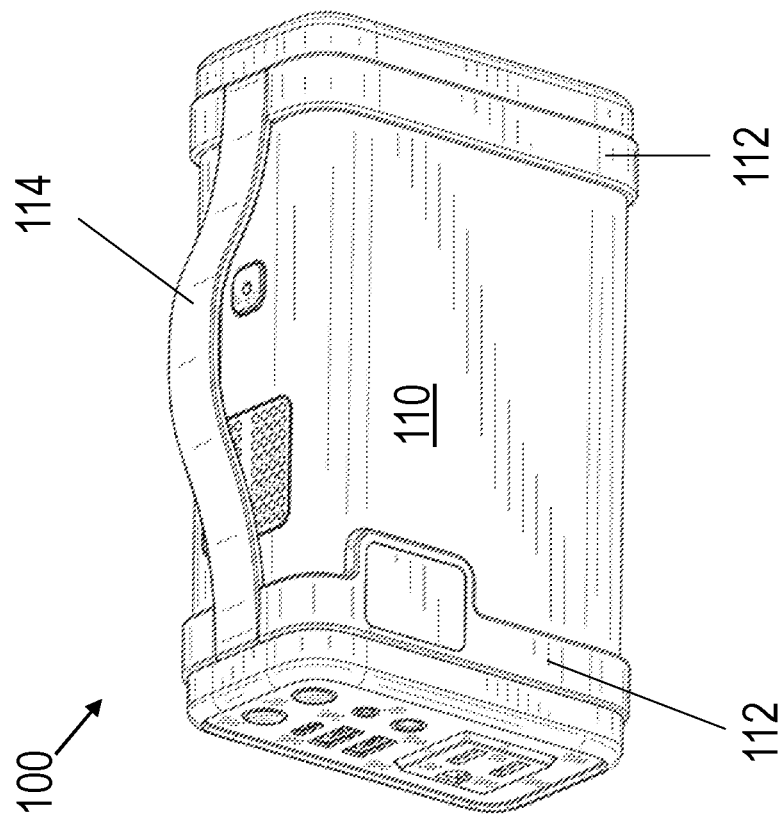
FIG. 1 illustrates a perspective view of an exemplary embodiment of an energy storage power supply in accordance with the general inventive concepts.

Referring now to the drawings, which are for purposes of illustrating exemplary embodiments of the subject matter herein only and not for limiting the same, FIG. 1 shows an exemplary embodiment of an energy storage power supply (also called power pack station 100).

The powerpack station 100 may include a shell 110 or similar housing at least partially enclosing one or more components of the powerpack station 100 therein.

The shell 110 may be hollow and sized and/or shaped for at least partially enclosing one or more components and/or systems therein. The shell 110 may include one or more openings and/or recessed areas sized or otherwise shaped for at least partially receiving or otherwise enclosing components and/or systems of the powerpack station 100.

In some embodiments, the shell 110 may include a cover 112 or similar outer covering (e.g., a leather or artificial leather coating), which may be provided for improving the aesthetics of the power supply device and for providing surface friction and/or texture to improve user experiences and comfort levels when operating the powerpack station 100.

In some embodiments, the cover 112 may include one or more openings corresponding to one or more of the openings of the shell 110. It should be appreciated that the entire shell 110 may be coated or covered, or in some embodiments, only portions of the shell may include a cover 112 or be coated to improve user experience.

In some embodiments, the powerpack station 100 may include a handle 114 or similar strap for carrying the powerpack station 100. The handle 114 may be secured or otherwise attached to the shell 110 and/or the cover 112 for maneuverability.

Figure 2:
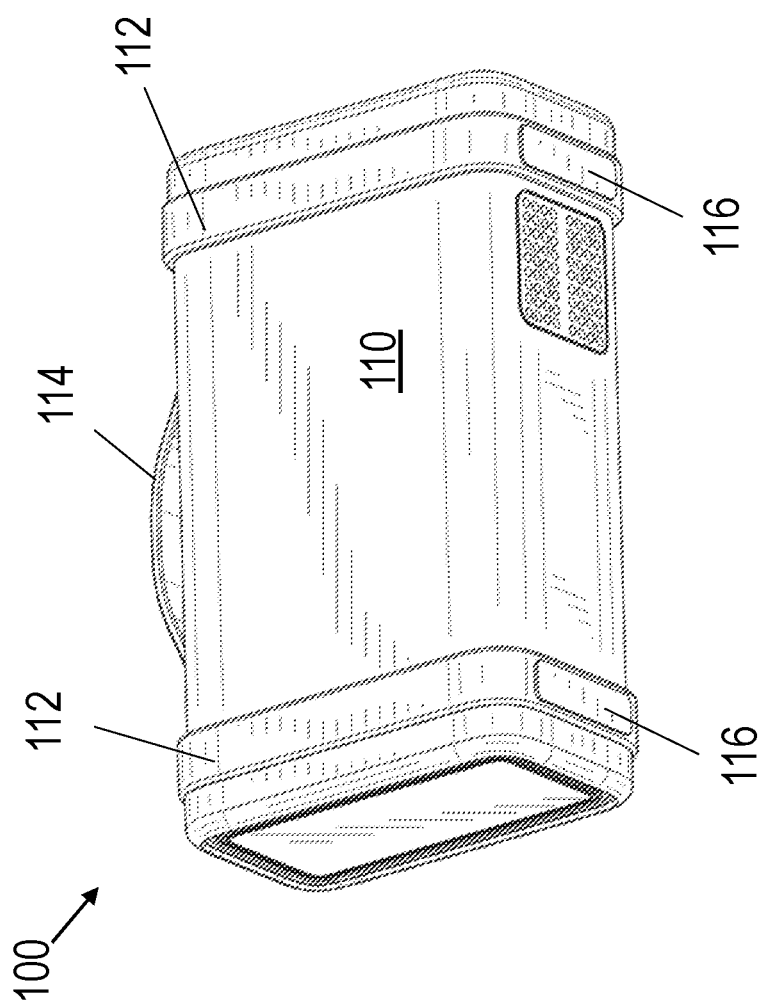
FIG. 2 illustrates a second perspective view an exemplary embodiment of an energy storage power supply in accordance with the general inventive concepts.

In some embodiment, the powerpack station 100 may include one or more anti-skid pads 116. The anti-skid pads may be arranged or otherwise positioned on the shell 110 and/or cover 112 to reduce or eliminate a movement of the powerpack station 100, for example, when in use. In the embodiment of FIG. 2, a pair of anti-skid pads 116 are provided (e.g., at an underside of the powerpack station 100).

With reference now to FIG. 3, in some embodiments, the shell 110 may be formed of two or more pieces (e.g., an upper shell 118 and a lower shell 120) selectively secured or otherwise attached together to form the shell 110.

With continue reference to the figures, the powerpack station 100 may include a plurality of compartments arranged within the shell 110. In the exemplary embodiment of FIG. 3, the powerpack station 100 includes three compartments, including a mainboard compartment 122, a battery compartment 124, and a lighting compartment 126.

The powerpack station 100 may further include one or more air ducts 128 (e.g., heat dissipation air ducts (two shown in FIG. 3) arranged or otherwise positioned along one or more of the compartments of the powerpack station 100. In some embodiments, the air ducts 128 may be positioned on the same side (and/or ends) of the powerpack station 100 or at opposed sides or ends of the powerpack station 100.

With continue reference to FIG. 3, the powerpack station 100 may include a plurality of circuit boards therein for performing the powerpack station 100 functions.

In some embodiments, the plurality of circuit boards may include an AC circuit board 130, a DC circuit board 132, an interface circuit board, a lighting circuit board, a key circuit board, and a battery protection board. The mainboard compartment 122 may include one or more of circuit mainboards installed therein (e.g., the AC circuit board and/or DC circuit board). The battery compartment 124 may include the battery protection board installed therein and/or one or more batteries 134 (e.g., lithium ion batteries). The lighting compartment 126 may include the lighting circuit board installed therein and/or one or more lighting assemblies or components (e.g., a lamp panel 136 and/or a lamp 138). It should be appreciated that the one or more of the circuit boards may be operably connected to each other and the battery 134 for performing its functions.

In some embodiments, the lighting compartment, the battery compartment, and the mainboard compartment may be arranged from one end of the shell to the other end of the shell sequentially. Additionally, or alternatively, the pair of heat dissipation air ducts 128 may be arranged on one or more sides of the mainboard compartment one by one correspondingly.

The general inventive concept has the beneficial effects that: by arranging the three compartments in the shell of the energy storage power supply in a separate-compartment type structure design, heat sources in the shell are separated, which can prevent heat generated in the mainboard compartment and the lighting compartment from being dissipated into the battery compartment, separate the heat sources, and prevent the battery from failure in normal operation due to high temperature; and the arrangement of the heat dissipation air ducts facilitates the heat dissipation inside the mainboard compartment.

In some embodiments, for example, a minimal compact design may be employed. In order to miniaturize the powerpack station 100, major circuit systems are separated in a modularized manner, and then assembled and spliced during production to achieve high integration.

In some embodiments, dividing the shell into, for example, three compartments is intended to isolate heat generated from using the mainboard and the lamp panel work from being diffused to the battery.

The mainboard generates a large amount of heat when working, especially in an AC working state. For better heat dissipation, the powerpack station 100 is designed with very reasonable heat dissipation air ducts. The air inlet of the air duct is designed on the leftmost side of the mainboard compartment, and the air outlet of the air duct is designed on the rightmost side of the mainboard compartment. The heat dissipation air duct runs through the entire DC circuit board and the entire AC circuit board to bring heat to the outside. In order to realize better convection between the internal heat and the outside, a miniaturized heat dissipation fan is further installed at the air outlet to blow outside according to the design, which reduces the temperature, implements low energy consumption and has more stable performances.

On the basis of the foregoing technical solution, the following improvements may also be provided.

In some embodiments, the circuit mainboard is composed of a plurality of circuit boards which are mutually spaced and stacked in the mainboard compartment 122. Employing the further solution above has the beneficial effects that: the circuit board is modularly designed and stacked to reduce the space occupied by the circuit board and improve the heat dissipation efficiency of the circuit board; moreover, the circuit boards are spaced apart to prevent short circuit between the circuits, which facilitates the installation and maintenance of the circuit board.

As an alternative solution to the above mutually spaced and stacked arrangement, the AC circuit board 130, the DC circuit board 132, the interface circuit board, the lighting circuit board, the key circuit board, and the battery protection board may be vertically welded in a longitudinal direction of the shell in sequence.

Employing the further solution above has the beneficial effects that: the circuit board is modularly designed and stacked to reduce the space occupied by the circuit board and improve the heat dissipation efficiency of the circuit board; moreover, the circuit boards are spaced apart to prevent short circuit between the circuits, which facilitates the installation and maintenance of the circuit board.

In order to realize the miniaturization of the energy storage power supply, the circuit board may be modularized and miniaturized, and generally divided into six major module boards comprising the AC circuit board 130, the DC circuit board 132, the interface circuit board, the lighting circuit board, the key circuit board and the battery protection board. It should be appreciated that one or more of the circuit boards may be grouped to form one circuit board (e.g., an AC/DC circuit board).

In some embodiments, one function of the AC circuit board 130 is to convert a 12V DC to a 110V AC or 220V AC to meet the requirements of commercial power for different regions and different standards. Two sets of optional solutions may be provided, for example, a 110V AC inverter module and a 220V AC inverter module. Different standard voltage outputs of the powerpack station 100 can be realized by changing different modules.

In some embodiments, the AC output power may reach 120 W, which can meet the power consumption of small power AC equipment such as laptops, fans, displays, and lighting lamps, etc.

In some embodiments, the AC circuit board 130 may be provided with various protection measures such as short circuit protection, over-power protection, temperature protection, which is safer to use.

In some embodiments, and in order to meet the different power consumption standards of various countries, besides the above-mentioned AC circuit board 130 having two AC voltage outputs for selection, this replaceable concept can also be introduced into an external output interface device. For example, an AC socket may be directly and detachably clamped into the panel and sockets with different standards can be clamped to the panel with to satisfy different socket standards in different countries and regions.

There are two types of AC sockets: US specifications (US standard sockets) and international common specifications (universal sockets).

In some embodiments, the AC output may be designed to have an independent start key. When the start key is pressed independently, the AC output is started, and a key indicator is on; when the start key is pressed independently again, the AC output may be stopped and the key indicator is off.

In some embodiments, the main functions of the DC circuit board 132 in the powerpack station 100 includes DC-DC, product state control, battery control, display control, etc. The interface circuit board may be mainly used for external output and input interfaces and status display of each product.

In some embodiments, the powerpack station 100 may adopt a 3.5 DC socket interface, and a charging device adopts a DC19V2A adapter. A charging cutoff voltage at the battery end is 16.83V, a charging cutoff current is less than 0.3 A, an over-discharge protection voltage is 12.4V, and voltages of converting from pre-charging to constant current charging and then to constant voltage charging are 12.48V and 16.76V respectively.

In some embodiments, a DC port may adopt a 5.5 DC socket, which is larger than the 3.5 DC socket of the charging interface, thus preventing the problem of wrong insertion of two ports. The output voltage is 12V to 16.8V. The port has short circuit and over-current protection.

Output characteristics of common USB-A port: an output voltage and an output current are 5V2.4 A, D+/D− voltage is 2.8V, a cutoff current is 90 mA, and the port has short circuit and over-current protection. Output characteristics of USB-A-QC3.0 port: output voltages and output currents are 3 A, 9V2 A and 12V1.5 A, a cutoff current is 60 mA, and the port has short circuit and over-current protection. Output characteristics of Type-C port: an output voltage and an output current are 5V3 A, D+/D− is short connected, a cutoff current is 90 mA, and the port has short circuit and over-current protection.

In some embodiments, the DC circuit board 132 and the interface circuit board may be spliced by vertical welding, which has the characteristics of space saving, large through-current and close cable run distance.

In some embodiments, a temperature for charging and discharging high-temperature protection may be: 50° C.±5° C. A temperature for releasing charging and discharging high-temperature protection may be: 40° C.±5° C.

In some embodiments, a temperature for charging and discharging low-temperature protection may be: −5° C.±5° C. A temperature for releasing charging and discharging low-temperature protection may be: 0° C.±5° C.

Additionally, or alternatively, the DC circuit board 132 may be designed with a driving control circuit (MCU control) for the heat dissipation fan. When the AC output is started, the MCU may send out an instruction to drive the fan to dissipate heat.

It should be appreciated that the powerpack station 100 may continue to perform its desired operations (i.e., its functions) while being charged and/or discharged.

In some embodiments, the DC circuit board 132 may be designed with an MCU to control the running status of the whole product, such as charging and discharging, display, temperature control, lighting, etc.

The MCU may control a "188" digital tube to display the electric quantity, charge-discharge status, and temperature protection of the powerpack station 100.

With continued reference to the figures, the powerpack station 100 may further include a heat dissipation fan 140. In some embodiments, the heat dissipation fan 140 may be rotatably arranged at one side of the mainboard compartment 122, and an air outlet of the heat dissipation fan 140 may be arranged opposite to at least one of the heat dissipation air ducts 128.

It should be appreciated that employing the above solution has the beneficial effects that: the arrangement of the heat dissipation fan 140 improves the heat dissipation efficiency inside the mainboard compartment 122 and improves the reliability of the powerpack station 100.

In some embodiments, the lighting compartment 126, the battery compartment 124 and the mainboard compartment 122 are integrally formed with the shell 110. Employing the further solution above has the beneficial effects that: the lighting compartment, the battery compartment and the mainboard compartment are integrally formed with the shell, which facilitates the production and installation of the shell, improves the loading capacity of the shell, and improves the stability of the shell.

In some embodiments, the powerpack station 100 may include a lamp panel 142 and an interface panel 144. In some embodiments, the lamp panel 142 may include a lamp 146. The lamp panel 142 may be installed in the lighting compartment 126. Additionally, or alternatively, the interface panel 144 may be arranged at the other end of the shell 110 (e.g., opposite the lamp panel 142), and an may be detachably provided with a socket.

Employing the further solution above has the beneficial effects that: the arrangement of the lamp panel 142 enables the powerpack station to have a lighting function, and an interface in the interface panel 144 may be used to connect electrical appliance parts thereto.

In some embodiments, one side of the socket located in the shell is provided with a pair of or three slots, and the interface circuit board is connected with a plurality of plugs corresponding to the number of slots. During production, sockets of different models and specifications (such as US standard sockets or universal sockets) may be installed according to the actual customized requirements of the user.

In some embodiments, one end of the powerpack station 100 may be a lighting lamp. The lamp panel 136 may be provided with a LED lamp. The AC socket may be a US standard socket or a universal socket.

In some embodiments, a plurality of DC voltage output modes may be provided for the powerpack station 100, such as DC12V, DC5V, QC3.0 (DC5V, 9V, 12V), etc., which basically satisfy the emergency charging of various hand-held devices and small DC devices, such as mobile phones, tablets, cameras, mini-watt DC12V electric tools, portable air pumps, etc.

Additionally, or alternatively, an AC110V 60 Hz (US standard) and/or AC220V 50 Hz (National standard) may be provided, which may carry various AC power devices with a maximum load of less than 120 W, such as tablets, fans, displays, lighting lamps, etc.

In some embodiments, the LED lighting function, which may be a 3 W LED lighting function, may provide three lighting modes including a hard light, general light, and/or a weak light.

In some embodiments, the interface panel 144 may include an AC switch and/or a DC switch employing an independent and safe split switch design, which may reduce the self-consumption loss and improve the use safety. By employing the split design of the AC switch and the DC switch, AC switch and the DC switch respectively control and manage the AC and DC outputs thereof, so that the powerpack station 100 is safer and more reliable.

In some embodiments, the lighting circuit board may include five sets of LED lamps. Each set may consist of three LED lamps connected in series. In some embodiments, 15 LEDs may be illuminated at the same time with a maximum power of 3 W. A driving circuit may be designed on the DC circuit board, and in some embodiments, may be controlled by an MCU uniformly and connected by a 2.0 lead wire.

In some embodiments, the key circuit may include a switching key for the lighting circuit, which may be connected with the DC board by a 1.5 lead wire and transmits a key signal to the MCU in the DC board for processing, thus realizing the control of the lighting circuit.

In some embodiments, the battery protection board may provide various protections including overcurrent, over-discharge, overcharge, and short-circuit protections.

In some embodiments, a lateral panel 148 may be provided. For example, as shown in FIG. 3, the lateral panel 148 is provided with a heat dissipation hole 150, and the lateral panel is arranged on one side of the shell 110.

The lateral panel 148 may be provided with a switch, wherein the switch is connected to the DC circuit board through a 1.5 lead wire, and the connection relationship between the switch and other elements belongs to the prior art.

Employing the further solution above has the beneficial effects that: the arrangement of the lateral panel facilitates the installation and disassembly of the energy storage power source, and facilitates the maintenance of the energy storage power source.

In some embodiments, the shell 110 may include an upper shell 118 and a lower shell 120. The upper shell 118 may be detachably buckled on the lower shell 120. In some embodiments, the upper shell and the lower shell may be fixed together by fasteners (e.g., four screws), and the lateral panel 148 may be clamped at a junction position of the upper shell 118 and the lower shell 120.

Employing the further solution above has the beneficial effects that: the design of splicing the upper shell with the lower shell and fixing the upper shell and the lower shell by four screws facilitate the installation and maintenance of the energy storage power supply.

In some embodiments, a display screen 152 may be included in the powerpack station 100. The display screen 152 may be arranged at a top end of the shell 110, the battery 134 may be arranged in the battery compartment 124, and the battery 134 may be a battery pack/set consisting of eight 21700-4000 mAh lithium ion batteries in two-parallel four-series connection.

Employing the further solution above has the beneficial effects that: the arrangement of the display screen and the battery is convenient for the user to visually check the state of the energy storage power supply, and is convenient for the user to perform charge management on the energy storage power supply.

In some embodiments, the two-parallel four-series connection is a mode of a battery set/pack. The battery is a portable small energy storage power supply, and the battery uses a lithium ion battery pack/set as a final energy storage member. The actual total capacity of the battery is about 120 Wh.

In order to make the battery work more stably and safely, a lithium battery protection circuit may be added inside the battery pack. The protection board can complete the short circuit protection, overcurrent protection, overcharge protection, over discharge protection, temperature protection and other protection of the battery pack. The connection relationships of all these circuits belong to the prior art.

The display screen may be a "188" digital screen, and the shell 110 may be provided with the "188" digital screen for displaying internal residual energy.

It is to be understood that the detailed description is intended to be illustrative, and not limiting to the embodiments described. Other embodiments will be apparent to those of skill in the art upon reading and understanding the above description. Moreover, in some instances, elements described with one embodiment may be readily adapted for use with other embodiments. Therefore, the methods and systems described herein are not limited to the specific details, the representative embodiments, or the illustrative examples shown and described. Accordingly, departures may be made from such details without departing from the spirit or scope of the general aspects of the present disclosure.

We claim:

1. An energy storage power supply, comprising:
   a shell,
   a mainboard compartment for installing a circuit mainboard of the energy storage power supply,
   a battery compartment for installing a battery of the energy storage power supply,
   a lighting compartment for installing a lamp panel of the energy storage power supply and a pair of heat dissipation air ducts, wherein the lighting compartment, the battery compartment and the mainboard compartment are arranged from one end to the other end of the shell sequentially, and the pair of heat dissipation air ducts are arranged on two sides of the mainboard compartment one by one correspondingly.

2. The energy storage power supply according to claim 1, wherein the circuit mainboard is composed of a plurality of circuit boards which are mutually spaced and stacked in the mainboard compartment.

3. The energy storage power supply according to claim 2, wherein the plurality of circuit boards are respectively an AC circuit board, a DC circuit board, an interface circuit board, a lighting circuit board, a key circuit board and a battery protection board.

4. The energy storage power supply according to claim 1, further comprising:
   a heat dissipation fan, wherein the heat dissipation fan can be rotatably arranged at one side of the mainboard compartment, and an air outlet of the heat dissipation fan is arranged opposite to one heat dissipation air duct in the pair of heat dissipation air ducts.

5. The energy storage power supply according to claim 1, wherein the lighting compartment, the battery compartment and the mainboard compartment are integrally formed with the shell.

6. The energy storage power supply according to claim 1, wherein an outer wall of the shell is coated with leather.

7. The energy storage power supply according to claim 1 further comprising:
   a lamp panel and an interface panel, wherein the lamp panel is provided with a lamp, the lamp panel is installed in the lighting compartment, the interface panel is arranged at the other end of the shell, and the interface panel is detachably provided with a socket.

8. The energy storage power supply according to claim 1 further comprising:
   a lateral panel, wherein the lateral panel is provided with a heat dissipation hole, and the lateral panel is arranged on one side of the shell.

9. The energy storage power supply according to claim 8, wherein the shell comprises an upper shell and a lower shell, the upper shell is detachably buckled on the lower shell, the upper shell and the lower shell are fixed by four screws, and the lateral panel is clamped at a junction position of the upper shell and the lower shell.

10. The energy storage power supply according to claim 1 further comprising:
    a display screen and a battery, wherein the display screen is arranged at a top end of the shell, the battery is arranged in the battery compartment, and the battery is a battery pack/set consisting of eight 21700-4000 mAh lithium ion batteries in two-parallel four-series connection.

* * * * *